(12) United States Patent
Paterson

(10) Patent No.: US 7,605,034 B2
(45) Date of Patent: *Oct. 20, 2009

(54) INTEGRATED CIRCUIT MEMORY CELLS AND METHODS OF FORMING

(75) Inventor: Alex Paterson, Parma, ID (US)

(73) Assignee: Micron Technology, Inc., Boise, ID (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/490,707

(22) Filed: Jul. 21, 2006

(65) Prior Publication Data

US 2006/0258083 A1    Nov. 16, 2006

Related U.S. Application Data

(63) Continuation of application No. 10/741,621, filed on Dec. 19, 2003, now Pat. No. 7,473,596.

(51) Int. Cl.
*H01L 29/72* (2006.01)

(52) U.S. Cl. ............... 438/228; 438/156; 438/210; 438/212; 438/248; 438/250; 438/251; 438/253; 438/249; 257/296; 257/301; 257/334

(58) Field of Classification Search ........... 438/238, 438/156, 210, 212, 228, 248, 249, 250, 251, 438/253; 257/296, 301, 334
See application file for complete search history.

(56) References Cited

U.S. PATENT DOCUMENTS 3,731,278 A    5/1973    Seely et al.
4,673,962 A    6/1987    Chatterjee et al.
4,829,017 A    5/1989    Malhi
4,864,375 A *  9/1989    Teng et al. .................. 257/302

(Continued)

FOREIGN PATENT DOCUMENTS

DE    3801525 A1    9/1988

(Continued)

OTHER PUBLICATIONS

Gudyma, et al., "Calculation of the Heat Mode of the Switching Powerful D-MOS Transistor Having a Vertical Structure", Radioelectronics and Communication Systems, vol. 40, No. 5, 1997, pp. 47-48.

(Continued)

*Primary Examiner*—Edward Wojciechowicz
(74) *Attorney, Agent, or Firm*—Wells St. John P.S.

(57) ABSTRACT

An integrated circuit memory cell includes a combined first capacitor electrode and first transistor source/drain, a second capacitor electrode, a capacitor dielectric between the first and second electrodes, and a vertical transistor above and including the first source/drain. The second source/drain may be included in a digit line inner conductor connecting a digit line to a transistor channel of the vertical transistor. The channel may include a semiconductive upward extension of the combined first electrode and first source/drain. The memory cell may be included in an array of a plurality of such memory cells wherein the second electrode is a common electrode among the plurality. The memory cell may provide a straight-line conductive path between the first electrode and a digit line, the path extending through the vertical transistor.

23 Claims, 10 Drawing Sheets

U.S. PATENT DOCUMENTS

| | | | |
|---|---|---|---|
| 4,873,560 | A | 10/1989 | Sunami |
| 4,937,641 | A * | 6/1990 | Sunami et al. ............... 257/302 |
| 4,990,980 | A * | 2/1991 | Wada ......................... 257/302 |
| 5,001,078 | A | 3/1991 | Wada |
| 5,001,526 | A | 3/1991 | Gotou |
| 5,006,909 | A | 4/1991 | Kosa |
| 5,072,269 | A | 12/1991 | Hieda |
| 5,102,817 | A | 4/1992 | Chatterjee et al. |
| 5,103,276 | A | 4/1992 | Shen et al. |
| 5,155,059 | A | 10/1992 | Hieda |
| 5,164,917 | A | 11/1992 | Shichijo |
| 5,208,657 | A | 5/1993 | Chatterjee et al. |
| 5,225,697 | A | 7/1993 | Malhi et al. |
| 5,250,830 | A | 10/1993 | Yagishita et al. |
| 5,252,845 | A | 10/1993 | Kim et al. |
| 5,291,438 | A | 3/1994 | Witek et al. |
| 5,300,450 | A | 4/1994 | Shen et al. |
| 5,334,548 | A | 8/1994 | Shen et al. |
| 5,350,708 | A * | 9/1994 | Yagishita et al. ............ 438/248 |
| 5,357,132 | A | 10/1994 | Turner |
| 5,414,288 | A | 5/1995 | Fitch et al. |
| 5,504,028 | A | 4/1996 | Wada et al. |
| 5,561,308 | A | 10/1996 | Kamata et al. |
| 5,888,864 | A | 3/1999 | Koh et al. |
| 5,939,760 | A | 8/1999 | Batra et al. |
| 6,060,723 | A | 5/2000 | Nakazato |
| 6,204,115 | B1 | 3/2001 | Cho |
| 6,222,218 | B1 * | 4/2001 | Jammy et al. ............... 257/301 |
| 6,246,083 | B1 | 6/2001 | Noble |
| 6,265,742 | B1 | 7/2001 | Gruening et al. |
| 6,300,199 | B1 | 10/2001 | Reinberg |
| 6,373,091 | B2 | 4/2002 | Horak |
| 6,426,252 | B1 | 7/2002 | Radens |
| 6,506,638 | B1 | 1/2003 | Yu |
| 6,518,615 | B1 | 2/2003 | Geusic et al. |
| 6,521,935 | B2 | 2/2003 | Krautschneider et al. |
| 6,528,837 | B2 * | 3/2003 | Forbes et al. ................ 257/302 |
| 6,531,727 | B2 | 3/2003 | Forbes et al. |
| 6,537,871 | B2 | 3/2003 | Forbes et al. |
| 6,635,526 | B1 | 10/2003 | Malik |
| 6,798,009 | B2 | 9/2004 | Forbes |
| 7,473,596 | B2 * | 1/2009 | Paterson ..................... 438/238 |
| 2001/0048624 | A1 | 12/2001 | Morimoto |
| 2002/0127803 | A1 | 9/2002 | Schlosser et al. |
| 2003/0048656 | A1 | 3/2003 | Forbes |
| 2004/0000690 | A1 | 1/2004 | Kujirai et al. |
| 2005/0106821 | A1 | 5/2005 | Snyder et al. |

FOREIGN PATENT DOCUMENTS

| | | |
|---|---|---|
| EP | 0333426 | 9/1989 |
| EP | 0 445 008 * | 9/1991 |
| EP | 0445008 A | 9/1991 |
| EP | 0445008 A1 | 9/1991 |
| JP | 60152056 | 10/1985 |
| JP | 62-200759 A | 9/1987 |
| JP | 02-083968 A | 3/1990 |
| JP | 02284465 | 11/1990 |
| JP | 05-110019 | 4/1993 |
| JP | 2004-58585 | 6/2004 |
| WO | WO 97/44826 | 11/1997 |
| WO | WO2005/010934 A2 | 3/2005 |

OTHER PUBLICATIONS

K.W. Guarini, et al., "Process Integration of Self-Assembled Polymer Templates Into Silicon Nanofabrication", J. Vac. Sci. Technol., vol. 20, No. 6, 2002, pp. 2788-2792.

Kunz, et al., "Reduction of Parasitic Capacitance in Vertical MOSFETs by Spacer Local Oxidation", IEEE Transactions on Electron Devices, vol. 50, Issue 6, Jun. 2003, pp. 1487-1493.

Wuensche, et al., "A 110 nm 512 Mb DDR DRAM with Vertical Transistor Trench Cell". Symposium on VLSI Circuits Digest of Technical Papers 2002, pp. 114-115.

Hyun-Jin, et al., "A Novel Pillar DRAM Cell for 4 Gbit and Beyond", 1998 Symposium on VLSI Technology, Digest of Technical Papers, Jun. 9-11, 1998, pp. 38-39.

PCT Written Opinion for PCT/US2004/042245 dated Sep. 6, 2005.
PCT Search Report for PCT/US2004/042245 dated Sep. 6, 2005.
PCT IPER for PCT/US2004/042245 dated Apr. 2, 2007.

* cited by examiner

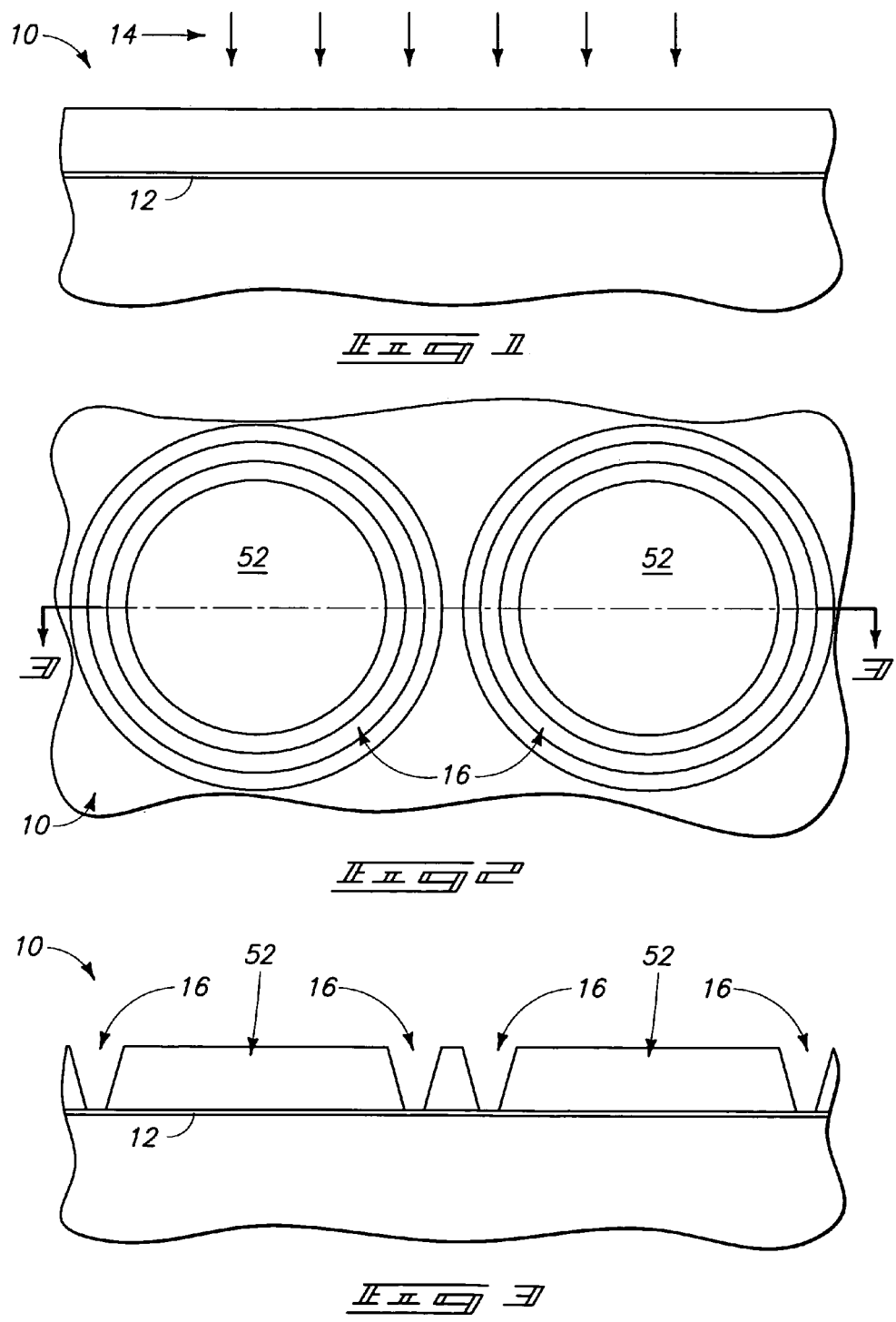

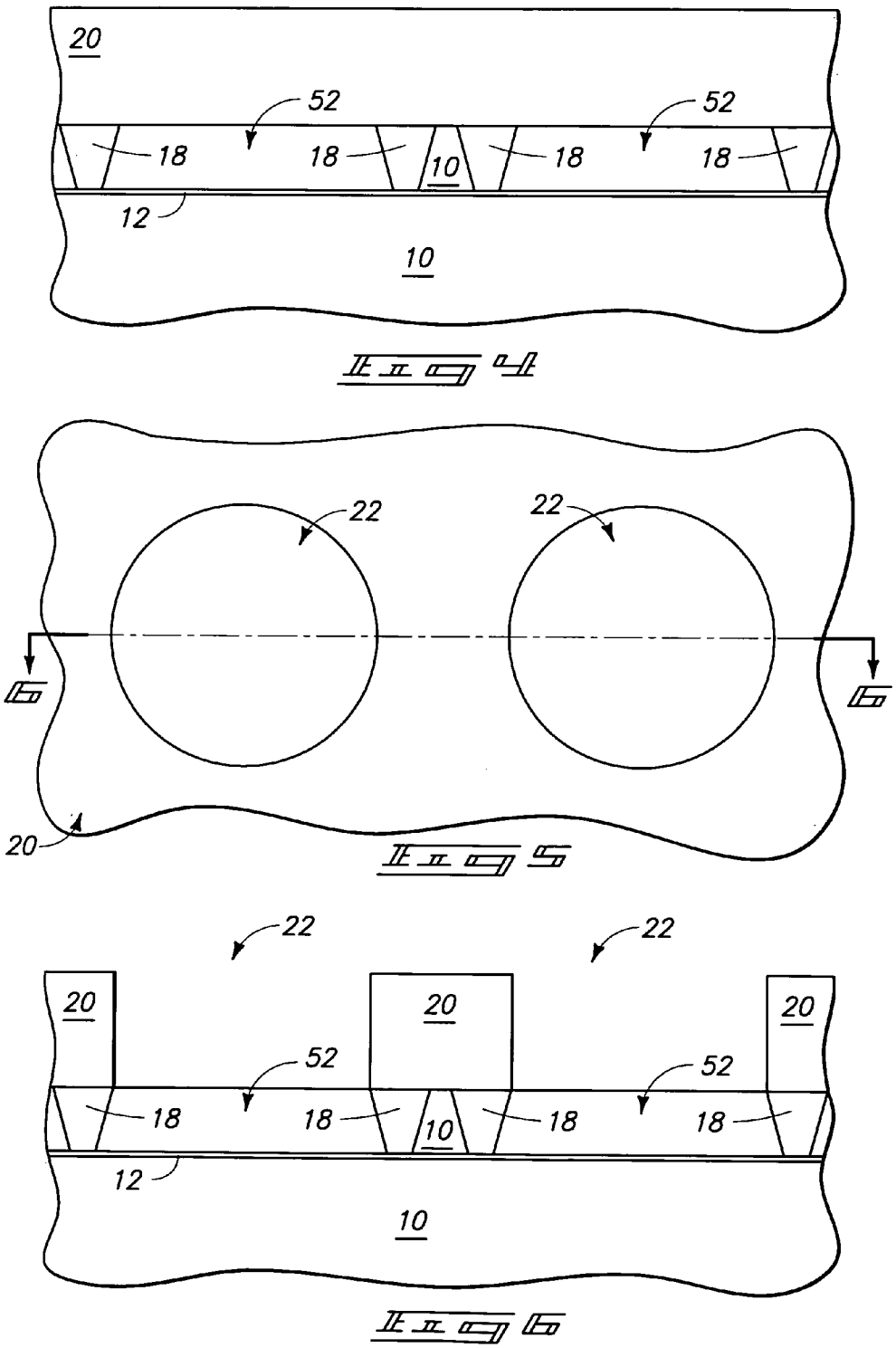

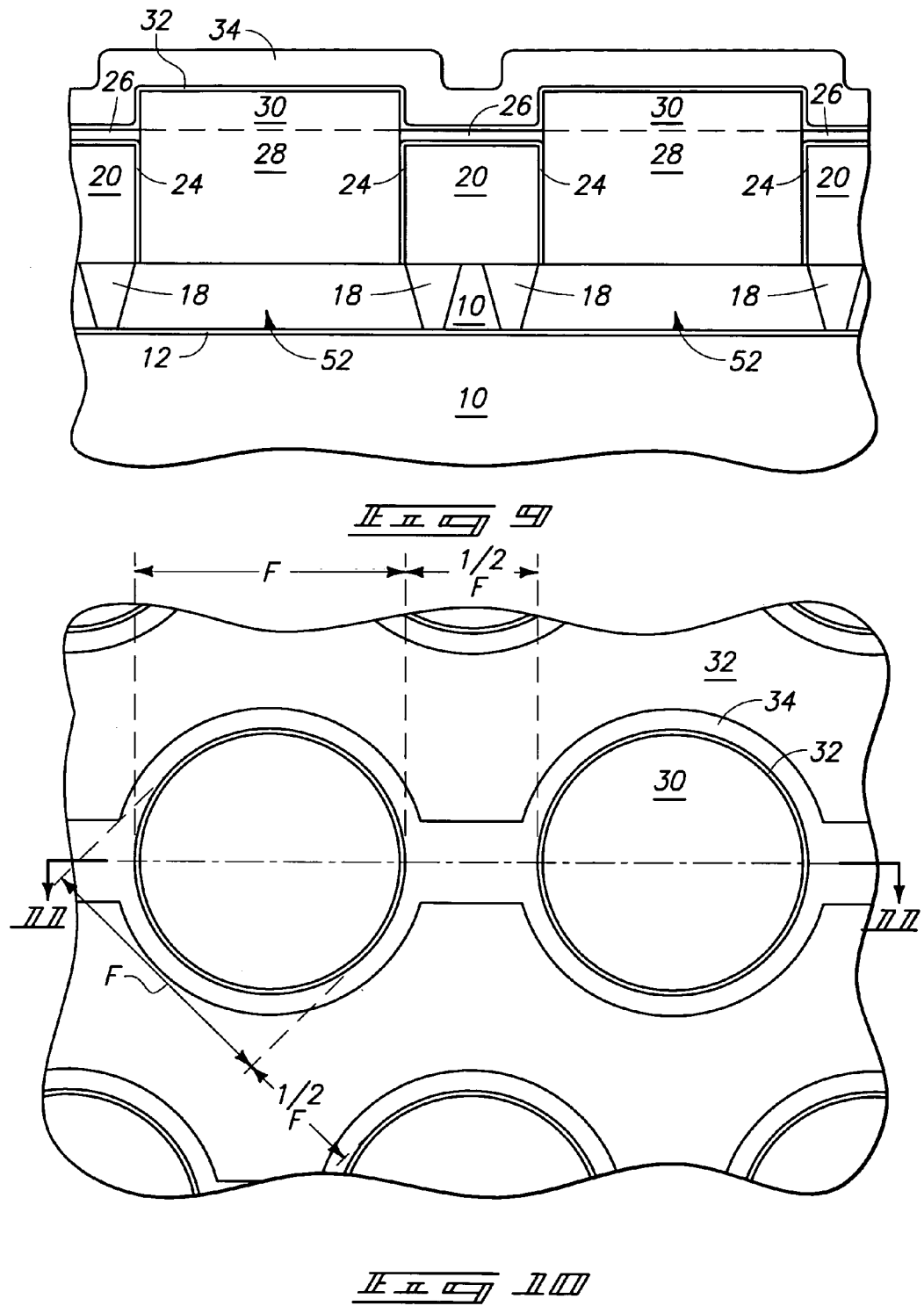

US 7,605,034 B2

INTEGRATED CIRCUIT MEMORY CELLS AND METHODS OF FORMING

RELATED PATENT DATA

This patent resulted from a continuation application of U.S. patent application Ser. No. 10/741,621, filed Dec. 19, 2003 now U.S. Pat. No. 7,473,596, and which is incorporated herein by reference.

TECHNICAL FIELD

The invention pertains to integrated circuit memory cells and memory cell fabrication methods.

BACKGROUND OF THE INVENTION

Miniaturization constitutes a continuing interest in designing and fabricating semiconductor devices. For example, it can be advantageous to decrease the size of memory cells used in integrated circuit memory devices. Those of ordinary skill know of a variety of configurations that are an attempt to decrease cell size. However, a disadvantage of some conventional configurations includes complicated structures that use a complicated process flow for fabrication. Also, another disadvantage includes interface size and connectivity problems between the complex conductive and semiconductive structures that become increasingly problematic as cell size decreases.

Accordingly, a need exists in the art for cell designs and fabrication methods that decrease cell size without unnecessarily complicating cell design and/or process flows.

SUMMARY OF THE INVENTION

In one aspect of the invention, an integrated circuit memory cell includes a combined first capacitor electrode and first transistor source/drain, a second capacitor electrode, a capacitor dielectric between the first and second electrodes, and a vertical transistor above and including the first source/drain. As an example, the second source/drain may be included in a digit line inner conductor connecting a digit line to a transistor channel of the vertical transistor. The channel may include a semiconductive upward extension of the combined first electrode and first source/drain. The memory cell may be included in an array of a plurality of such memory cells wherein the second electrode is a common electrode among the plurality. The memory cell may provide a straight-line conductive path between the first electrode and a digit line, the path extending through the vertical transistor.

In another aspect of the invention a plurality of integrated circuit memory cells include a bulk semiconductor substrate, an isolation layer buried in the substrate, and field isolation in the substrate, the field isolation surrounding a plurality of electrically isolated silicon bases over the isolation layer and within the substrate. A plurality of silicon columns extend upward from the plurality of silicon bases, individual columns including a combined first capacitor electrode and first transistor source/drain. Individual memory cells include a second capacitor electrode in common with the plurality of memory cells, a capacitor dielectric between the first and second electrodes, and a vertical transistor above and including the first source/drain.

By way of example, closed loop trenches through the substrate to the isolation layer can define the silicon bases and contain the field isolation. The columns can include epitaxial silicon. Alternatively, the columns can include part of the bulk semiconductor substrate, such as a bulk silicon wafer. Individual cell size can be 1.5F×1.5F, where F is capacitor size. Feature size of the transistor channel can be less than or equal to feature size of the first electrode.

Other aspects of the invention include methods of forming the described memory cell and plurality of memory cells.

BRIEF DESCRIPTION OF THE DRAWINGS

Preferred embodiments of the invention are described below with reference to the following accompanying drawings.

FIGS. 1, 3, 4, 6-9, 11, and 12 are partial sectional views at sequential process stages leading to formation of the memory cell of FIG. 12 formed on a substrate according to one aspect of the invention.

FIG. 2 is a top view of the processed substrate shown by sectional view in FIG. 3.

FIG. 5 is a top view of the processed substrate shown by sectional view in FIG. 6.

FIG. 10 is a top view of the processed substrate shown by sectional view in FIG. 11.

DETAILED DESCRIPTION OF THE PREFERRED EMBODIMENTS

Figure 7:
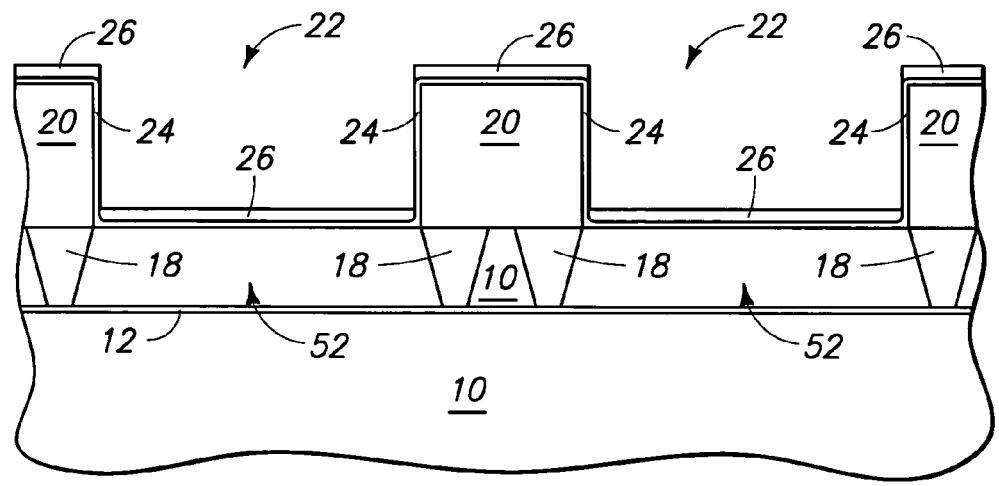

According to one aspect of the invention, an integrated circuit memory cell includes a combined first capacitor electrode and first transistor source/drain, a second capacitor electrode, a capacitor dielectric between the first and second electrodes, and a vertical transistor above and including the first source/drain. By way of example, the vertical transistor can include a transistor channel above the first source/drain, a gate conductor around the channel, and a second transistor source/drain above the channel. In a vertical transistor, a channel length "L" as determined by conventional means between a source and drain of the transistor is oriented in a substantially vertical direction with respect to a bulk substrate over which the transistor is formed instead of in a horizontal direction. For example, a bulk semiconductor wafer may define a horizontal plane and channel length "L" may be oriented substantially vertically with respect to the wafer plane. Channel length "L" may be oriented perpendicular with respect to the bulk substrate, but may also deviate from a perpendicular direction by up to 45° within the meaning of "substantially" vertical.

One advantage of providing the vertical transistor above the combined first capacitor electrode and first transistor source/drain is that a feature size of the channel can be less than or equal to a feature size of the first electrode. In this manner, memory cell size can be determined by the capacitor size. For example, the memory cell may have a cell size of 1.5F×1.5F ($2.25F^2$), where F is the capacitor size.

It can be a further advantage of the described memory cell structure to include a straight-line conductive path between the first electrode and a digit line, the path extending through the vertical transistor. The straight-line conductive path simplifies the structure of the memory cell components and may resolve problems of insufficient interface contact area and/or connectivity problems between memory cell components, such as between the capacitor and the transistor or between the digit line and a source/drain. As will be appreciated from additional discussion herein regarding the method of forming such a device, the described structure also simplifies process flows.

The methods and structures of the various aspects of the invention described herein may provide one or more integral contacts by combining structural features so that conventional contacts between such structural features may be eliminated. The methods and structures may also reduce or eliminate the amount of complex processing typically associated with providing conventional self-aligned contacts.

A conventional method can involve forming a memory cell including two transistors each having a source linked through a separate contact to a capacitor and including a common drain linked through another separate contact to a digit line. Reducing memory cell size often involves reducing contact area for such contacts. Accordingly, in a conventional method, the contacts are preferably formed self-aligned, for example, by selectively etching a contact opening through insulative material and between transistor gates to the common drain or one of the two sources. Material protecting the transistor gates, such as spacers or caps, is usually exposed in the process but hopefully not removed by the selective etching. Selective etching can be a complex process sensitive to minor errors. Filling the deep contact openings in successively repeated deposition steps thereafter forms the contacts. A single deposition step often is not sufficient to fill the deep contact opening. Use of integral contacts, such as described for some aspects of the invention herein, may reduce or eliminate complex selective etching and multi-step deposition involved in forming conventional self-aligned contacts.

The described feature of a combined first electrode and first source/drain especially simplifies design complexity and addresses interface and connectivity issues since the first electrode and first source/drain are combined into a single structural element. Accordingly, a conventional contact plug or analogous structure between the first electrode and first source/drain may be eliminated. As one example, the combined electrode and source/drain may include epitaxial silicon or part of a bulk semiconductor substrate. Accordingly, no interface exists between the first electrode and first source/drain. Appropriate conductive dopants may be provided according to the knowledge of those of ordinary skill to enable use of the epitaxial silicon or bulk semiconductor as both a capacitor electrode and a transistor source/drain.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

As a still further advantage, the second source/drain above the channel may be comprised by a digit line inner conductor, providing another combination of structural features. The combined feature also reduces memory cell complexity and addresses concerns about interface area and/or connectivity between the second source/drain and digit line inner conductor. Accordingly, a conventional contact plug or analogous structure between the digit line and second source/drain may be eliminated. The digit line inner conductor connects a digit line to the channel and also functions as the second source/drain.

The channel of the transistor may be combined with the structural element that includes the first electrode and the first source/drain. Accordingly, the channel may be a semiconductive upward extension of the combined first electrode and first source/drain. The combined first electrode and first source/drain may be a conductively doped semiconductive material to provide the desired functionality. The upward extension providing the channel may be an upward extension of a continuous semiconductive material that is undoped or contains a lower concentration of conductive dopant in comparison to the combined first electrode and first source/drain. Comparative dopant types and concentrations may be selected according to conventional knowledge for devices of similar function. A transistor implant may be used in keeping with conventional knowledge to set transistor characteristics, such as threshold voltage ($V_t$).

The various aspects of the invention also include a transistor channel that is not an upward extension of the combined first electrode and first source/drain. Instead, the channel may comprise a material different from a material of the combined electrode and source/drain. The channel may nevertheless directly contact the first source/drain. Similarly, the channel may directly contact the second source/drain. In the circumstance where the second source/drain is comprised by the digit line inner conductor, such inner conductor may directly contact the channel. It may be desirable to provide a conductive barrier between and in electrical contact with the channel and inner conductor even though the channel would not directly contact the second source/drain. In that arrangement.

With the channel above the first source/drain and the second source/drain above the channel, a gate conductor of the vertical transistor may advantageously laterally surround the channel. The gate conductor may be at approximately the same elevational position as the channel. Such configuration allows simple extension of the gate conductor between other memory cells of similar construction to provide a word line. Also, the dielectric and second electrode of the capacitor portion of the memory cell may surround the first electrode at least laterally. When the memory cell is comprised by an array of a plurality of memory cells, the second electrode may be a common electrode among the plurality. When formed to laterally surround the first electrode, the second electrode may be simply extended to other memory cells, creating the common electrode.

Figure 12:
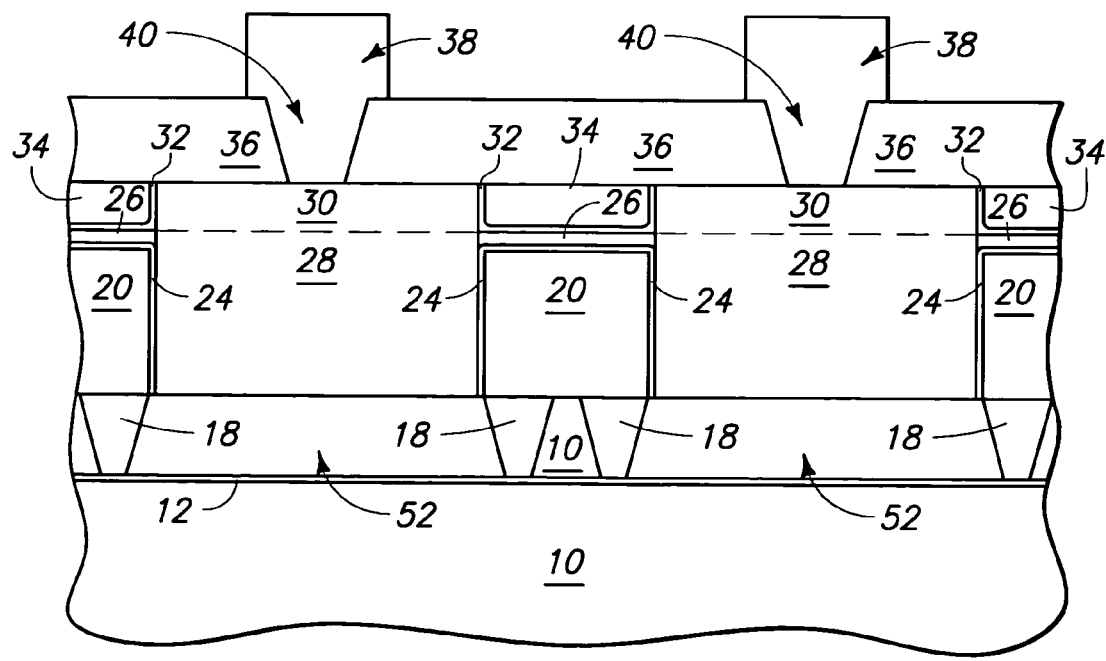

FIG. 12, as further understood from the top views shown in FIGS. 2, 5, 10, and 17, is one example of the various aspects of the invention. FIG. 12 shows a pair of electrode columns 28, an electrode layer 20, and a dielectric layer 24 between each electrode column 28 and electrode layer 20. The structure of FIG. 12 thus provides a first capacitor electrode, a second capacitor electrode, and a capacitor dielectric there between. FIG. 12 also shows a channel region 30 above each electrode column 28 formed as a semiconductive upward extension of each electrode column 28. Channel regions 30 thus form the channels of vertical transistors where electrode columns 28 also function as first transistor sources/drains.

Digit lines 38 are over inner conductors 40 that are in turn over channel regions 30. Inner conductors 40 also function as second transistor sources/drains for the vertical transistor. Channel regions 30 directly contact inner conductors 40. Dielectric layer 24 and electrode layer 20 laterally surround electrode columns 28. Conductor layer 34 laterally surrounds channel regions 30. In addition, the feature size of channel region 30 is approximately equal to the feature size of electrode column 28. Memory cell size is 1.5F×1.5F, where F is capacitor size (for this configuration, the diameter between opposing sidewalls of an opening 22 through electrode layer 20). Advantageously, a straight-line conductive path exists between electrode columns 28 and respective digit lines 38 extending through respective channel regions 30.

Another aspect of the invention includes an integrated circuit memory cell having a combined first capacitor electrode and first transistor source/drain, a second capacitor electrode proximate the first electrode, and a capacitor dielectric between the first and second electrodes. A transistor channel is directly above the first source/drain and a combined digit line inner conductor and second transistor source/drain is directly above the channel. By way of example, the memory cell may further include a digit line portion over and in electrical contact with the inner conductor and a straight-line conductive path between the first electrode and the digit line through the first source/drain, channel, and second source/drain.

According to a further aspect of the invention, a plurality of integrated circuit memory cells include a bulk semiconductor substrate, an isolation layer buried in the substrate, and field isolation in the substrate. The field isolation surrounds a plurality of electrically isolated silicon bases over the isolation layer and within the substrate. A plurality of silicon columns extends upward from the plurality of silicon bases. Individual columns provide a combined first capacitor electrode and a first transistor source/drain. Individual memory cells further include a second capacitor electrode in common with the plurality of memory cells, a capacitor dielectric between the first and second electrodes, and a vertical transistor above and including the first source/drain.

Figure 17:
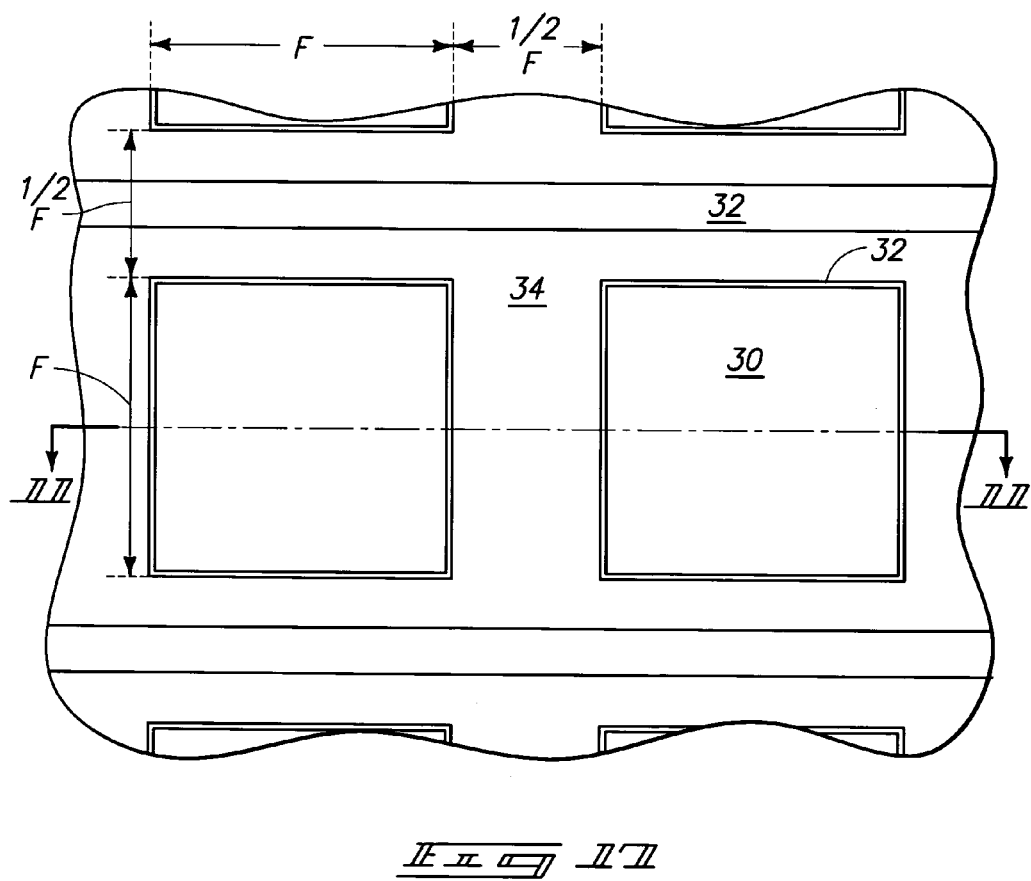
FIG. 17 is a top view of the processed substrate shown by sectional view in FIG. 11 having a structure alternative to that shown in the top view of FIG. 10.

By way of example, the substrate may include a bulk silicon wafer. The memory cells may further include closed loop trenches through the substrate to the isolation layer. The trenches may define the silicon bases and contain the field isolation. The closed loop trench may be circular or formed in another shape, such as a square. FIG. 17 shows a top view of channel regions 30 having square cross-sections. Accordingly, electrode column 28 beneath channel region 30 may also have a square cross-section and trench isolation 18 may also be formed as a square, closed loop. Also, a fill material between the plurality of first electrodes may include primarily the common second electrode. Alternatively, the film material between the plurality of electrodes may include primarily an insulative material over the common second electrode.

FIG. 12 also shows additional features of the various aspects of the invention. Specifically, an isolation layer 12 is shown buried in a substrate 10. Trench isolation 18 is shown contained within openings 16. Openings 16 are closed loop trenches through substrate 10 to isolation layer 12. Trench isolation 18 defines a plurality of electrically isolated bases over isolation layer 12 and within substrate 10. Electrode columns 28 extend upward from the plurality of silicon bases.

Figure 15:
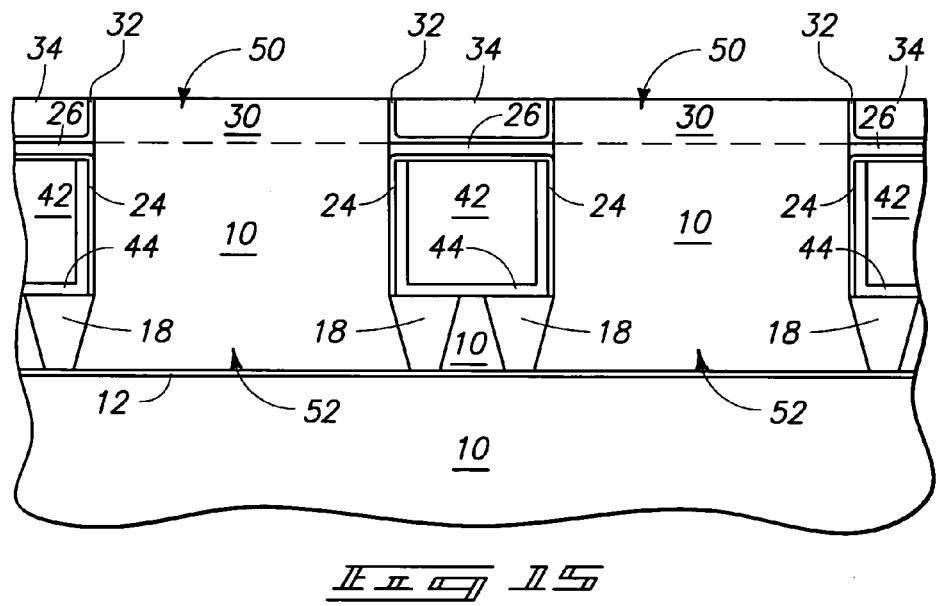

FIG. 12 also shows electrode layer 20 functioning as the primary fill material between electrode columns 28 as well as a common second electrode. A portion of FIG. 15 shows an alternative structure for fill material between first electrodes that can be incorporated into the memory cells of FIG. 12. In FIG. 15, an electrode layer 44 provides a common second electrode. An insulator layer 42 is formed over electrode layer 44 so that a fill material between the plurality of first electrodes constitutes primarily an insulative material.

FIGS. 1, 3, 4, 6-9, 11, and 12 show partial sectional views at sequential process stages leading to formation of the pair of memory cells in FIG. 12. In FIG. 1, ions 14 are implanted into substrate 10 to form an isolation layer 12 buried in substrate 10. Substrate 10 may be a bulk semiconductor substrate. Implanting oxygen ions into a silicon substrate may be used to form isolation layer 12 as a silicon oxide layer, such as silicon dioxide. Other semiconductive materials may be used for substrate 10 and other insulative materials may be used for isolation layer 12. A depth of isolation layer 12 below an outermost surface of substrate 10 may be shallow, for example, from about 1,000 to about 4,000 Angstroms (Å).

After forming isolation layer 12, field isolation may be formed over isolation layer 12 in substrate 10. Although a variety of techniques known to those of ordinary skill may be used to form field isolation, one aspect of the present invention involves forming closed loop openings 16 in substrate 10. Openings 16 may extend completely through substrate 10 to isolation layer 12, as shown in FIG. 3. FIG. 2 shows a top view of the processed substrate shown by sectional view in FIG. 3. Openings 16 thus define a pair of bases 52 over isolation layer 12. Depositing an insulative material and removing excess insulative material to form trench isolation 18 shown in FIG. 4 may fill openings 16. As will be appreciated from descriptions herein, trench isolation 18 and isolation layer 12 allow each base 52 to be electrically isolated from other bases 52.

FIG. 4 also shows an electrode layer 20 deposited over substrate 10. Openings 22 may be formed in electrode layer 20 to provide a container for a container type of capacitor as shown in FIGS. 5 and 6. It is advantageous to form openings 22 completely through electrode layer 20, exposing bases 52. However, a container-type capacitor may nevertheless be formed in openings 22 without extending completely through electrode layer 20. Electrode layer 20 may be conductively doped polysilicon, as wells as other materials suitable for a common electrode of a memory array in accordance with the knowledge of those of ordinary skill. A thickness of electrode layer 20 may be from about 100 to about 400 Å.

The method includes depositing a dielectric layer 24 within openings 22 and over sidewalls of openings 22. Possible compositions for dielectric layer 24 include silicon nitride, aluminum oxide, hafnium oxide, tantalum oxide, and combinations thereof formed to a thickness of from about 25 to about 75 Å. An insulator layer 26 may be formed over horizontal surfaces of features shown in FIG. 7, but not over vertical surfaces such as sidewalls of openings 22, using methods known to those of ordinary skill. Insulator layer 26 may function as a dielectric spacer to separate later-formed features from portions of dielectric layer 24. Possible compositions for insulator layer 26 include silicon oxide, silicon nitride, and combinations thereof formed to a thickness of from about 200 to about 500 Å.

Figure 8:
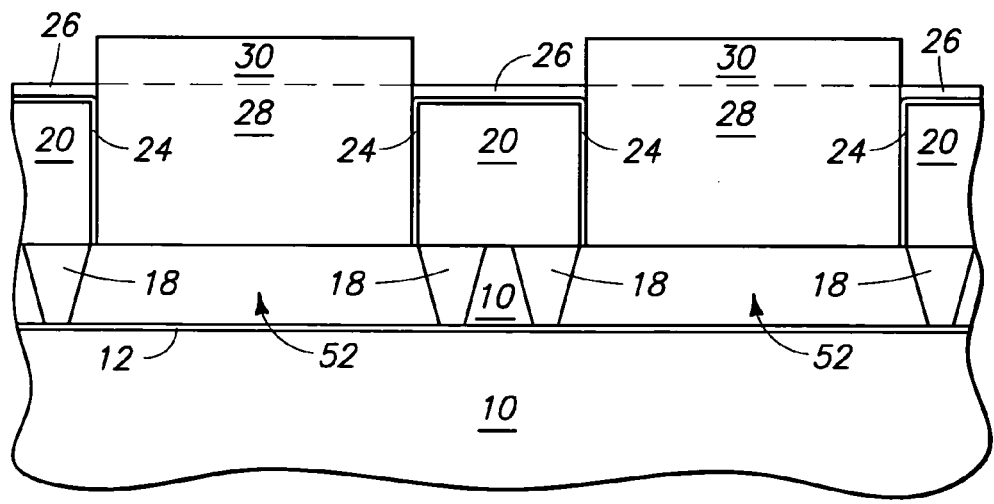

Next, at least a portion of dielectric layer 24 and insulator layer 26 formed at the bottom of openings 22 over bases 52 is removed to expose at least portions of bases 52. As shown in FIG. 8, electrode columns 28 and channel regions 30 may be formed on and in contact with bases 52. Electrode column 28 may be formed by a growth method such as epitaxial silicon growth. Conductive dopants may be provided during growth or may be provided after completing the growth process.

One advantage of using a growth process is that upon completion of a suitable height for electrode column 28, the growth process may be continued to provide an upward extension of electrode column 28, forming semiconductive material for channel region 30. As an alternative, channel region 30 may be formed in a separate process, such as deposition of a semiconductive material even though not expressly shown in the Figures. If dopants are provided during growth of electrode column 28, then providing such conductive dopants can be stopped during growth of channel region 30. If dopants are provided after extending growth upward to provide channel region 30, then dopants can be implanted in electrode column 28 to a depth below channel region 30. Semiconductive epitaxial silicon or bulk semiconductive material provide suitable materials for channel 30. One advantage of electrode column 28 is that it may perform a dual function of a combined capacitor electrode and transistor source/drain. Channel region 30 may have a thickness of from about 500 to about 1500 Å.

An advantage of some aspects of the present invention is that capacitor structures may be formed before transistor structures since forming capacitor structures often involves heat steps, as known to those of ordinary skill. The dopants implanted when forming transistors structures, as known to those of ordinary skill, can tend to drift when exposed to the heat steps used to form capacitor structures. As structures become smaller, dopant concentration and position become more critical. By forming capacitor structures up front in processing, at least some heat steps can occur before formation of transistor structures or before dopant implanting of such structures. In many conventional processes, it is impossible to form capacitor structures before transistor structures due to device configuration.

Figure 11:
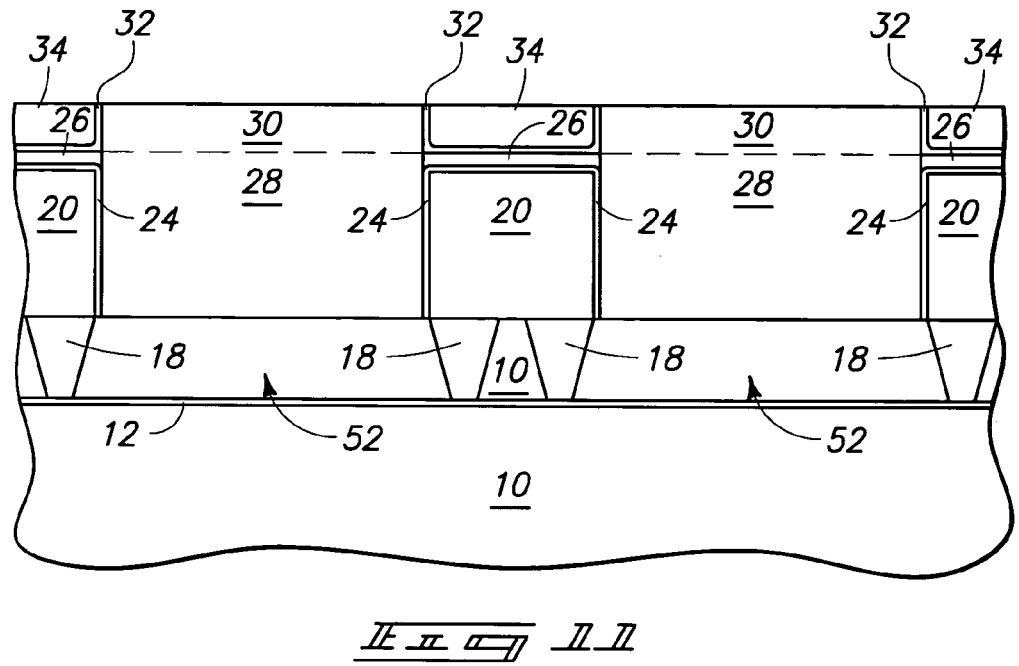

For the substrate in process in FIG. 9, an insulator layer 32 is formed over channel region 30 to provide a gate insulator and a conductor layer 34 is formed over insulator layer 32 to provide a gate conductor. Conventional methods may also form a gate insulator, such as a gate oxide. Excess portions of conductor layer 34 may be removed to define a gate conductor functioning as a word line, as shown in FIGS. 10 and 11. Such figures also show insulator layer 32 and conductor layer 34 completely removed from directly above channel region 30. However, as an option, some portion of insulator layer 32 and/or conductor layer 34 may remain directly above channel region 30 so long as the remaining material does not disrupt proper functioning of memory cell components, for example, by electrically shorting between components.

As shown in FIG. 12, an isolation layer 36 may be formed over the intermediate structure of FIG. 11. A variety of insulative materials may be suitable for isolation layer 36. At this point, peripheral devices desired to form a functioning memory device may be constructed in other areas of substrate 10 not shown in the partial sectional views referenced herein. Conventional methods may be used to form such peripheral devices. Thereafter, integrated circuit wiring may be formed to create appropriate conductive connections between memory cells and between memory cells and the peripheral devices.

As shown in FIG. 12, openings were formed through isolation layer 36 to expose a portion of channel region 30. Metal-containing conductive material was deposited, followed by subtractive metal patterning to form digit lines 38 above isolation layer 36 and inner conductors 40 extending from digit lines 38 to channel regions 30. Alternatively, a damascene process may be used where a digit line pattern is formed using additional openings in isolation layer 36 or subsequently formed insulative material. Metal-containing conductive material is deposited followed by planarization to remove excess conductive material, leaving digit lines and inner conductors.

Depending upon materials selected and performance criteria, it may be desirable to form a conductive barrier layer (not shown) between inner conductors 40 and channel regions 30. A suitable barrier layer of, for example titanium nitride, may enhance stability of the contact interface between inner conductor 40 and channel region 30. Notably, inner conductor 40 may perform a dual function as a combined digit line inner conductor and second transistor source/drain. In such manner, cell size may be minimized, cell structure and/or process flow may be simplified, and interface area and/or connectivity problems between memory cell components may be addressed.

Figure 13:
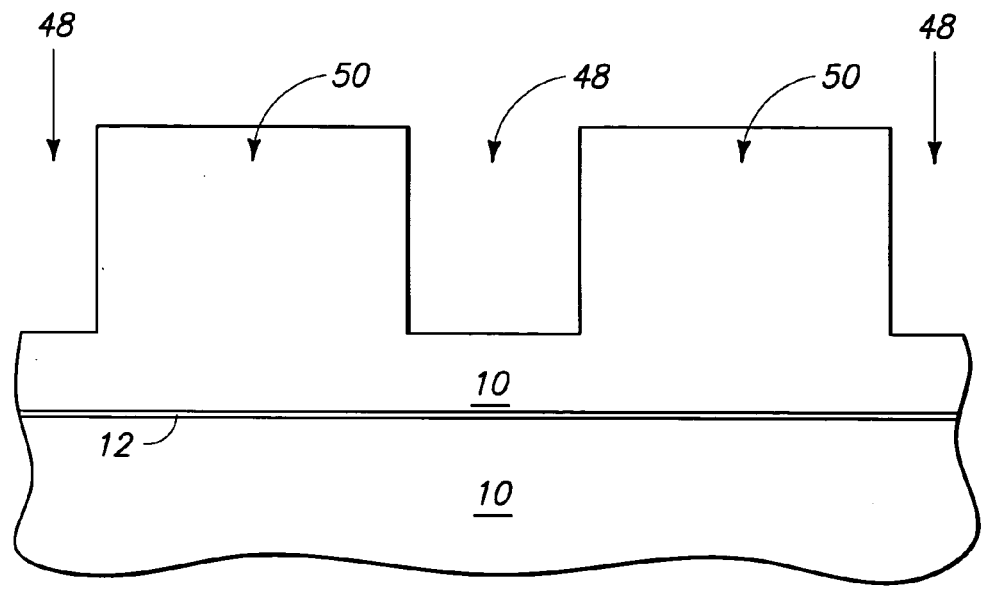
FIGS. 13-15 are partial sectional views at sequential process stages leading to formation of the memory cell of FIG. 15 formed on a substrate according to another aspect of the invention.
Figure 14:
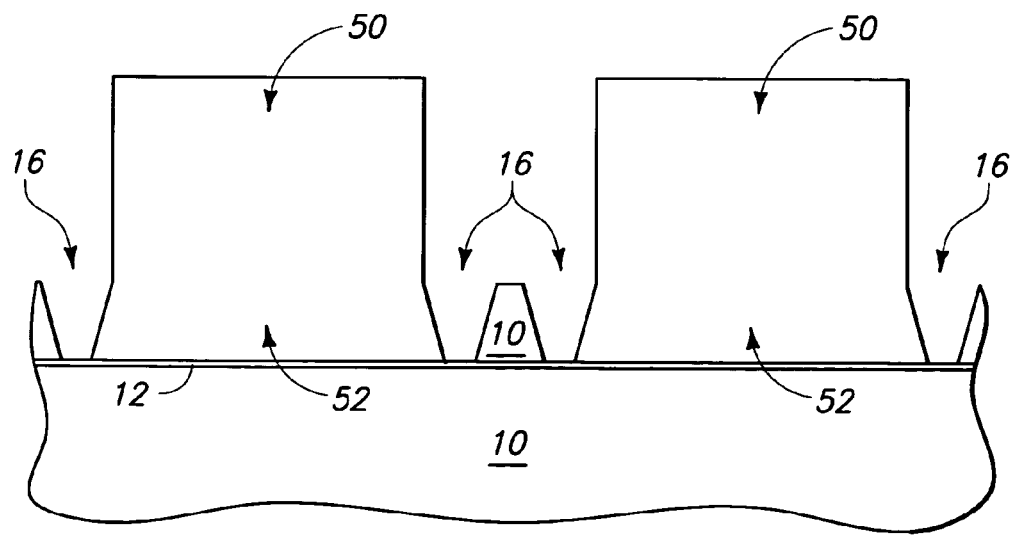

FIGS. 13-15 are partial sectional views at sequential process stages leading to formation of the memory cell of FIG. 15. In FIG. 13, ions 14 such as shown in FIG. 1 may be implanted to a greater depth to provide isolation layer 12 shown in FIG. 13. Removal of substrate material to form opening 48 can define a plurality of columns 50 formed from substrate 10. Removal of additional substrate material to form openings 16 shown in FIG. 14 can provide a similar structure to bases 52, electrode columns 28, and channel regions 30 shown in FIG. 8. Given the above description of forming various features of memory cells, those of ordinary skill will appreciate that the FIG. 14 intermediate structure can be used to form the device of FIG. 15. Constructing peripheral devices and providing integrated circuit wiring may follow.

Notably, electrode layer 20 shown in FIG. 12 that provides a common second electrode among the plurality of memory cells may be used in the alternative aspect shown in FIG. 15. Currently, FIG. 15 shows an alternative structure as an electrode layer 44 that still functions as a common second electrode among the plurality of memory cells, but a fill material between first electrodes of the memory cells includes primarily insulator layer 42.

The structural arrangement of dielectric layer 24, insulator layer 26 functioning as a dielectric spacer, and insulator layer 32 functioning as a gate insulator are shown identically in FIGS. 15 and 12. Even so, such structural arrangement is primarily an artifact of the method used to obtain the device of FIG. 12. Accordingly, a different structural arrangement may be desirable in FIG. 15 even though not shown.

For example, dielectric layer 24 formed over sidewalls of electrode columns 50 may be extended up along the whole sidewall to function both as capacitor dielectric and gate insulation. Accordingly, the portions of dielectric layer 24 and insulator layer 32 appearing in FIG. 15 directly above insulator layer 42 need not be present. Instead, after forming dielectric layer 24 (including as a gate insulator), electrode layer 44 may be formed as shown in FIG. 15 then insulator layer 42 provided to fill up to and including the height shown for insulator layer 26 between electrode columns 50. Conductor layer 34 may then be formed on and in contact with insulator layer 42.

Figure 16:
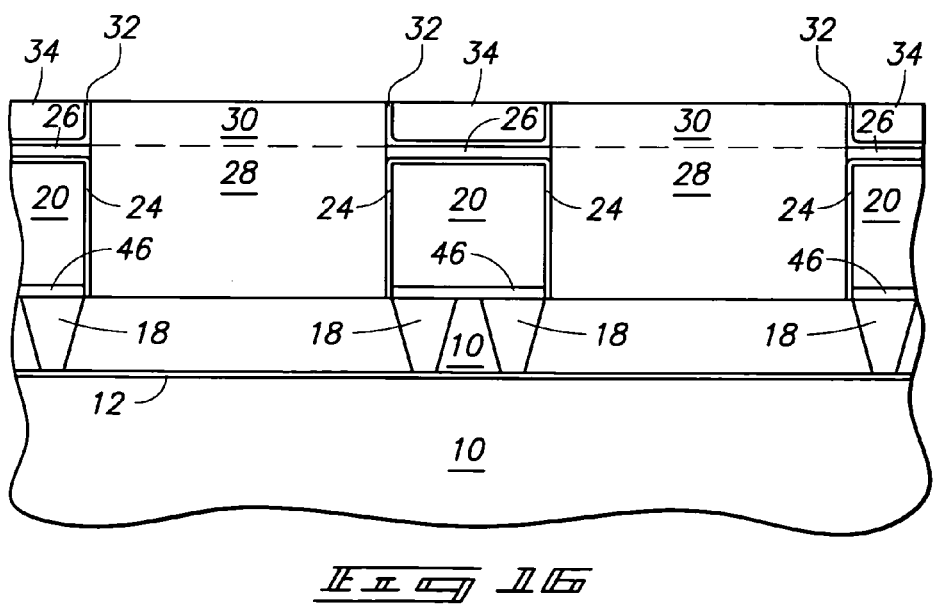
FIG. 16 is a partial sectional view of a memory cell formed on a substrate according to a further aspect of the invention.

A further alternative is shown in FIG. 16 wherein the device of FIG. 11 is present except with isolation layer 46 formed below electrode layer 20. Isolation layer 46 may be formed on substrate 10 immediately prior to forming electrode layer 20 that was shown in FIG. 4. Continued processing as shown in FIGS. 6-9 and 11 and discussed herein will yield the device of FIG. 16.

According to one aspect of the invention, a memory cell fabrication method includes forming a combined first capacitor electrode and first transistor source/drain, forming a second capacitor electrode, and forming a capacitor dielectric between the first and second electrodes. The method includes forming a vertical transistor above and including the first source/drain. By way of example, forming the second electrode can include depositing a second electrode layer on a substrate, removing some of the second electrode layer, and forming a first opening completely through the second electrode layer, exposing the substrate. Forming the dielectric can include depositing a dielectric layer within the first opening and over a sidewall of the first opening, removing some of the dielectric layer, and forming a second opening completely through the dielectric layer, exposing the substrate. The combined first electrode and first source/drain may be formed within the first and second openings and over the dielectric.

As an alternative example, forming the combined first electrode and first source/drain may include removing a portion of a silicon substrate, the removing providing a silicon column. Forming the dielectric may include depositing a dielectric layer over a sidewall of the column. Forming the second electrode may include depositing a second electrode layer over the dielectric.

Forming the vertical transistor can include leaving an uppermost portion of the combined first electrode and first source/drain as semiconductive, the semiconductive uppermost portion defining a transistor channel of the vertical transistor. Also, forming the vertical transistor can include forming a transistor channel above the first source/drain, forming a gate conductor layer around the channel and above the second capacitor electrode, and planarizing the gate conductor layer. Excess portions of the gate conductor layer may be removed, with a remaining portion of the gate conductor layer forming a gate conductor laterally surrounding the channel.

In another aspect of the invention, a memory cell fabrication method includes forming a second capacitor electrode layer on a substrate, forming an opening completely through the second electrode layer, exposing the substrate, and forming a capacitor dielectric layer over sidewalls of the opening with the substrate exposed through the dielectric layer. A combined first capacitor electrode and first transistor source/drain may be epitaxially grown from the exposed substrate. The method includes forming a transistor channel directly above the first source/drain and forming a combined digit line inner conductor and second transistor source/drain directly above the channel.

In a further aspect of the invention, a method of fabricating a plurality of memory cells includes ion implanting and forming an isolation layer buried in a bulk semiconductor substrate and forming field isolation in the substrate. The field isolation surrounds a plurality of electrically isolated silicon bases over the isolation layer and within the substrate. The method includes forming a plurality of silicon columns extending upward from the plurality of silicon bases, individual columns including a combined first capacitor electrode and first transistor source/drain. A second capacitor electrode may be deposited, excess portions of the second electrode layer removed, and a second electrode formed in common with the plurality of memory cells. A capacitor dielectric may be formed between the common second electrode and the plurality of first electrodes. Individual vertical transistors can be formed above and including individual first sources/drains of the plurality of memory cells.

By way of example, forming the columns may include epitaxially growing the columns from exposed silicon bases after forming the field isolation and the second electrode. Alternatively, forming the columns can include removing a portion of the substrate, the removing providing the silicon columns, and afterwards forming the field isolation. The method may further include selecting a thickness of the second electrode such that primarily the second electrode fills a gap between the plurality of first electrodes. Alternatively, the method can further include depositing an insulative material over the second electrode and between the plurality of first electrodes. Thickness of the second electrode and insulative material may be selected such that primarily the insulative material fills a gap between the plurality of first electrodes.

Figure 18:
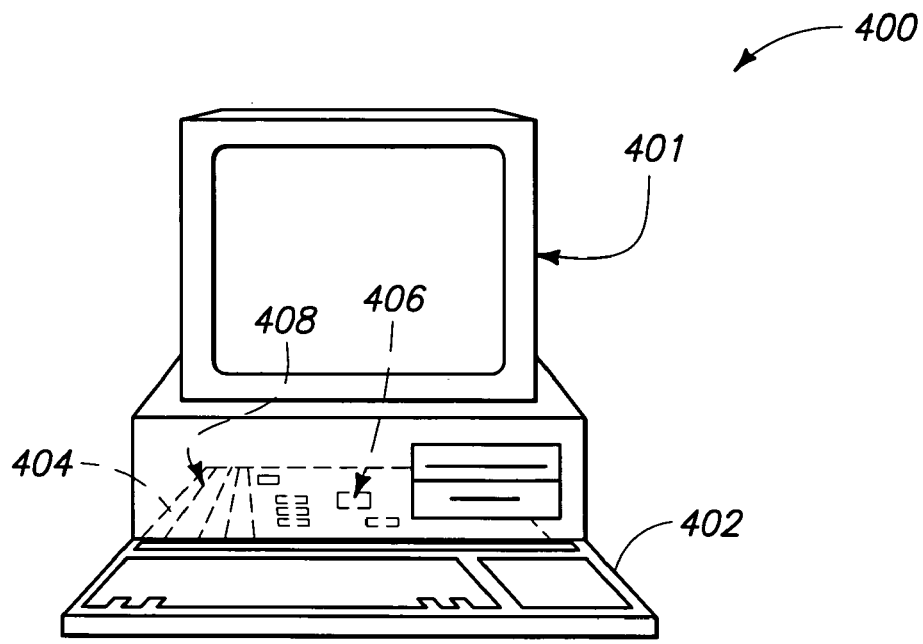
FIG. 18 is a diagrammatic view of a computer illustrating an exemplary application of the present invention.
Figure 19:
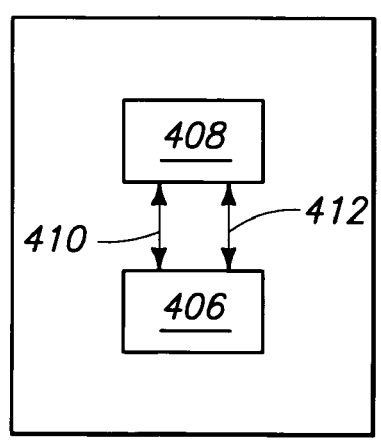
FIG. 19 is a block diagram showing particular features of the motherboard of the FIG. 14 computer.

Other aspects of the invention include memory devices containing the described memory cells and computer systems containing such memory devices along with a microprocessor. FIG. 18 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 19. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 20:
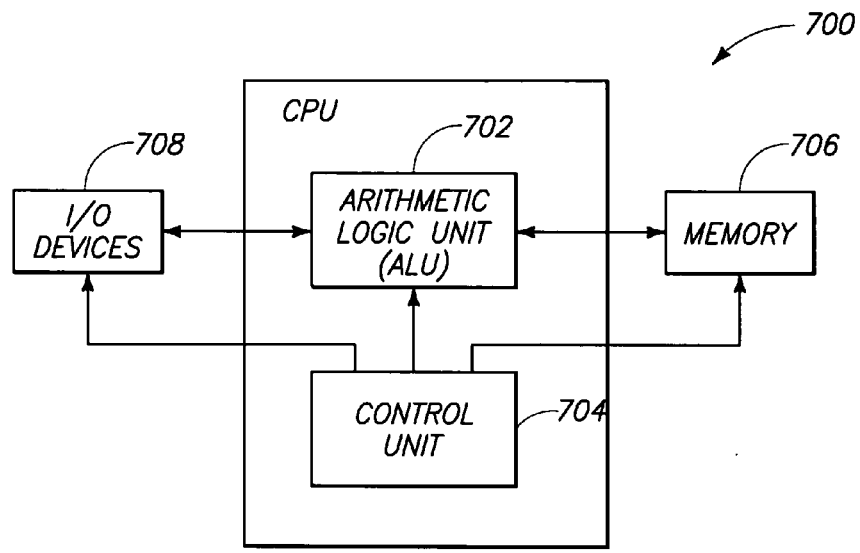
FIG. 20 is a high level block diagram of an electronic system according to an exemplary aspect of the present invention.

FIG. 20 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 21:
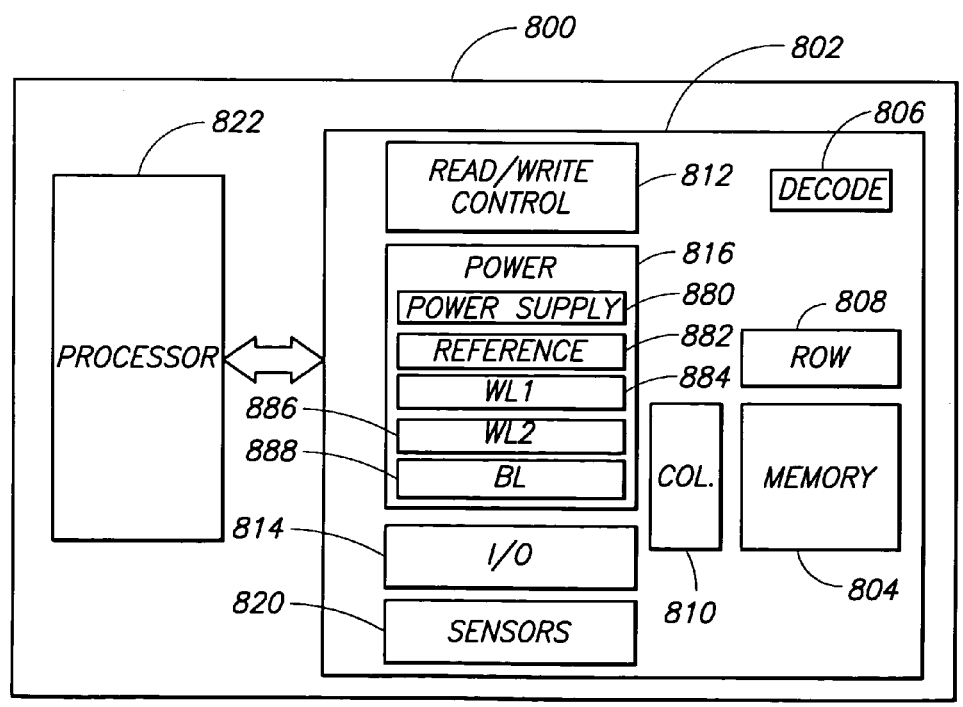
FIG. 21 is a simplified block diagram of an exemplary memory device according to an aspect of the present invention.

FIG. 21 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word line with pulses, circuitry 886 for providing the second word line with pulses, and circuitry 888 for providing the bit line with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A memory cell fabrication method comprising:
depositing a second capacitor electrode layer on a substrate, removing some of the second electrode layer, and forming a first opening completely through the second electrode layer, exposing the substrate;
depositing a dielectric layer within the first opening and over a sidewall of the first opening, removing some of the dielectric layer, and forming a second opening completely through the dielectric layer, exposing the substrate;
forming a combined first capacitor electrode and first transistor source/drain within the first and second openings and over the dielectric, the capacitor dielectric being between the first and second electrodes; and
forming a vertical transistor above and including the first source/drain.

2. The method of claim 1 wherein forming the combined first electrode and first source/drain comprises epitaxial growth of a silicon column from an exposed substrate.

3. The method of claim 1 further comprising forming an electrically isolated silicon base within the substrate and forming the combined first capacitor electrode and first transistor source/drain by epitaxial growth of a silicon column from the base exposed through the second opening.

4. The method of claim 1 wherein forming the vertical transistor comprises leaving an uppermost portion of the combined first electrode and first source/drain as semiconductive, the semiconductive uppermost portion defining a transistor channel of the vertical transistor.

5. The method of claim 4 wherein feature size of the channel is less than or equal to feature size of the first electrode.

6. The method of claim 1 wherein forming the vertical transistor comprises forming a transistor channel directly above the first source/drain and forming a digit line inner conductor directly above the channel, a second transistor source/drain of the vertical transistor being comprised by the inner conductor.

7. The method of claim 1 wherein forming the vertical transistor comprises forming a transistor channel above the first source/drain, forming a gate conductor layer around the channel and above the second capacitor electrode, planarizing the gate conductor layer, and removing excess portions of the gate conductor layer, a remaining portion of the gate conductor layer forming a gate conductor laterally surrounding the channel and channel length being oriented in a substantially vertical direction with respect to the substrate.

8. The method of claim 1 wherein the dielectric and second electrode surround the first electrode at least laterally at the same elevational level as the first electrode.

9. The method of claim 1 comprising forming the memory cell as part of an array of a plurality of such memory cells wherein the second electrode comprises a common electrode among the plurality.

10. The method of claim 1 wherein cell size is 1.5F×1.5F, where F is feature size of the capacitor dielectric and the first capacitor electrode considered in combination.

11. The method of claim 1 wherein the memory cell comprises a straight-line conductive path between the first electrode and a digit line, the path extending through the vertical transistor.

12. A memory cell fabrication method comprising:
forming an isolation layer buried in a substrate;
removing a portion of the substrate, the removing providing a silicon column;

forming field isolation in the substrate, the field isolation surrounding and electrically isolating a silicon base over the isolation layer and within the substrate;

forming a combined first capacitor electrode and first transistor source/drain comprised by the silicon column, the silicon column extending upward from the silicon base;

forming a second capacitor electrode;

forming a capacitor dielectric between the first and second electrodes; and forming a vertical transistor above and including the first source/drain.

13. The method of claim 12 wherein:

forming the dielectric comprises depositing a dielectric layer over a sidewall of the column; and forming the second electrode comprises depositing a second electrode layer over the dielectric.

14. The method of claim 12 wherein forming the vertical transistor comprises leaving an uppermost portion of the combined first electrode and first source/drain as semiconductive, the semiconductive uppermost portion defining a transistor channel of the vertical transistor.

15. The method of claim 12 wherein forming the vertical transistor comprises forming a transistor channel directly above the first source/drain and forming a digit line inner conductor directly above the channel, a second transistor source/drain of the vertical transistor being comprised by the inner conductor.

16. The method of claim 12 wherein forming the vertical transistor comprises forming a transistor channel above the first source/drain, forming a gate conductor layer around the channel and above the second capacitor electrode, planarizing the gate conductor layer, and removing excess portions of the gate conductor layer, a remaining portion of the gate conductor layer forming a gate conductor laterally surrounding the channel and channel length being oriented in a substantially vertical direction with respect to the substrate.

17. The method of claim 12 wherein cell size is 1.5F×1.5F, where F is feature size of the capacitor dielectric and the first capacitor electrode considered in combination.

18. The method of claim 12 wherein the memory cell comprises a straight-line conductive path between the first electrode and a digit line, the path extending through the vertical transistor.

19. A memory cell fabrication method comprising:

forming a second capacitor electrode layer on a substrate;

forming an opening completely through the second electrode layer, exposing the substrate;

forming a capacitor dielectric layer over sidewalls of the opening with the substrate exposed through the dielectric layer;

epitaxially growing a combined first capacitor electrode and first transistor source/drain from the substrate exposed through the dielectric layer;

forming a transistor channel directly above the first source/drain; and providing a single material forming a combined digit line inner conductor and second transistor source/drain directly above the channel and lacking a material-to-material interface between the digit line inner conductor and second source/drain.

20. The method of claim 19 wherein forming the channel comprises leaving an uppermost portion of the combined first electrode and first source/drain as semiconductive.

21. The method of claim 19 further comprising forming a gate conductor layer around the channel and above the second capacitor electrode, planarizing the gate conductor layer, and removing excess portions of the gate conductor layer, a remaining portion of the gate conductor layer forming a gate conductor laterally surrounding the channel and channel length from the first source/drain to the second source/drain being oriented in a substantially vertical direction with respect to the substrate.

22. The method of claim 19 wherein cell size is 1.5F×1.5F, where F is feature size of the capacitor dielectric and the first capacitor electrode considered in combination.

23. The method of claim 19 wherein the memory cell comprises a straight-line conductive path between the first electrode and a digit line, the path extending through the first source/drain, channel, and second source/drain.

* * * * *